(12) United States Patent
Orlidge et al.

(10) Patent No.: US 6,397,353 B1
(45) Date of Patent: May 28, 2002

(54) METHOD AND APPARATUS FOR PROTECTING SENSITIVE DATA DURING AUTOMATIC TESTING OF HARDWARE

(75) Inventors: Leslie Arthur Orlidge, Lafayette; Luis Gude, Rochelle Park; Stephen Thomas Maio, Mendham, all of NJ (US)

(73) Assignee: Allied Signal Inc., Morristown, NJ (US)

( * ) Notice: Subject to any disclaimer, the term of this patent is extended or adjusted under 35 U.S.C. 154(b) by 0 days.

(21) Appl. No.: 09/289,490

(22) Filed: Apr. 9, 1999

Related U.S. Application Data

(60) Provisional application No. 60/082,113, filed on Apr. 17, 1998.

(51) Int. Cl.[7] ............................ G06F 11/00; G06F 11/26
(52) U.S. Cl. ........................................ 714/25; 324/73.1
(58) Field of Search ............................... 714/25, 32, 1, 714/736, 739; 324/73.1; 370/241

(56) References Cited

U.S. PATENT DOCUMENTS

| | | | |
|---|---|---|---|
| 5,202,889 A | * | 4/1993 | Aharon et al. |
| 5,572,666 A | * | 11/1996 | Whitman |
| 6,006,028 A | * | 12/1999 | Aharon et al. |

FOREIGN PATENT DOCUMENTS

| FR | 002694093 A1 | * | 1/1994 |
|---|---|---|---|

OTHER PUBLICATIONS

Mel Lewis: "Plugging Potential Security Leaks when Testing Classified Systems on Unclassified Automatic Test Equipment", Proceedings of the International Automatic Testing Conference. Autotestcon '83. New Horizons in Automatic Testing, Nov. 1–3, 1983, pp. 86–90, XP002124005, p. 88, right–hand column, line 6—p. 89, left–hand column, line 20.

* cited by examiner

Primary Examiner—Gopal C. Ray
(74) Attorney, Agent, or Firm—Loria B. Yeadon

(57) ABSTRACT

A system for testing a hardware unit containing sensitive information, while inhibiting access to that information, includes a secure program in an Automated Test Station and an interface circuit. The test station has a programmed processor, as well as generating equipment which generates pseudo test signals and measuring devices which measure the response of the unit to actual test signals. Within the processor of the test station there is a test program which does not indicate the sensitive information and a run-time program that interprets the test-program to generate encoded commands for carrying out the test. The interface circuit receives the encoded commands and the pseudo test signals from the test station, decodes the encoded commands and generates the actual test signals. These actual test signals are routed to the unit under test by the interface circuit. The interface circuit also receives the response from the unit to the test signals, encodes it and sends it to the test station for interpretation. The secure run-time program, the encoding by the test station, as well as the encoding and decoding by the interface circuit greatly inhibit the opportunity to uncover the sensitive information during testing of the unit.

22 Claims, 4 Drawing Sheets

METHOD AND APPARATUS FOR PROTECTING SENSITIVE DATA DURING AUTOMATIC TESTING OF HARDWARE

RELATED APPLICATION

This application relates to U.S. Provisional Application Ser. No. 60/082,113 filed on Apr. 17, 1998, which has the same title and inventors as the present application and is hereby incorporated by reference herein.

FIELD OF THE INVENTION

The present invention relates to electrical testing of hardware and, more particularly, to testing of hardware that contains classified or sensitive information.

BACKGROUND OF THE INVENTION

Some hardware may contain classified or sensitive information which is necessary or useful in its operation. For example, a cellular phone may include encryption technology to provide privacy in making calls. This sensitive information may belong to a government, the manufacturer or the end user. If the information belongs to the end user, it may want to restrict access to the information to only a few trusted employees. If the information belongs to the government or the manufacturer, they may not want the end user to have access to it.

Devices that contain sensitive information must nevertheless be tested. Typically the end user may want to conduct these tests. For efficiency, the end user would want to use any employee capable of performing the test, without regard to their security status or the desires of the government or manufacturer, who may own the information. Thus, there is a need to test such hardware in a manner that reduces the opportunity for the tester to uncover the classified information. The protection of classified or sensitive data is also required during the repair of hardware.

Testing of hardware in an Automatic Test System (ATS) requires two basic items: (1) the Automatic Test System or test station and (2) the test program that controls the tester's stimulus and measure instruments to verify the performance of the hardware unit under test. In general, testing of classified hardware requires that the test programs have access to the classified data stored in the hardware. That is, the classified parameters must be known and coded into the test program in order to verify that the hardware is operating according to the performance specifications. This means that the end user of the test station and test program can very easily extract the classified information. Traditionally, this situation has been handled by making the entire test station a classified item, thus making it necessary to use personnel with security clearances to test the equipment. While this is viable for domestic applications, it is very impractical for foreign users.

SUMMARY OF THE INVENTION

In order to overcome this problem, in accordance with the invention, use is made of a combination of a secured test station run time system software algorithms, hardware encoding techniques, and test program routines that ensure the safeguarding of classified data. In particular, an interface is provided that is located between the test station and the hardware being tested. The interface is constructed with knowledge of the classified information and the algorithms in the test station.

The test station is programmed by the end user with generic tests of the operating parameters of the hardware. This test information is encoded to form pseudo test signals and parameters sent to the interface so that monitoring of the control lines from the test station will not reveal the true test parameters. This may include the sending of spurious signals at certain times, which the interface is programmed to ignore. The interface is also connected to stimulus and measurement equipment in the test station which provide test signals and measure the response of the hardware to those signals. The interface encodes the test results and sends them back to the test station for evaluation as to whether the hardware is operating properly or not.

BRIEF DESCRIPTION OF THE DRAWINGS

The foregoing and other features of the present invention will be more readily apparent from the following detailed description and drawings of an exemplary embodiment of the invention in which.

DESCRIPTION OF AN EXEMPLARY EMBODIMENT OF THE INVENTION

Figure 1:
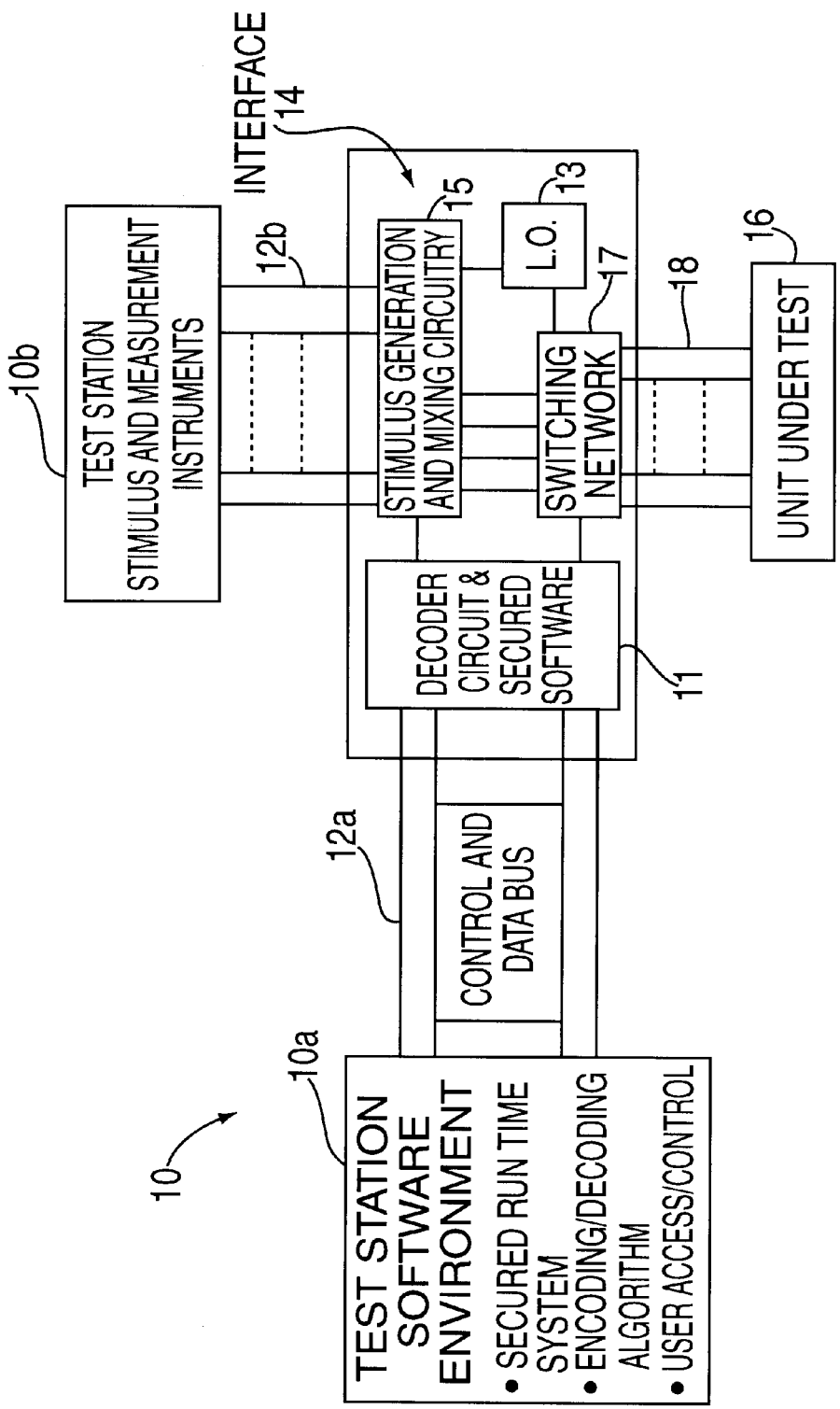
FIG. 1 is a block diagram of an exemplary embodiment of the invention.

FIG. 1 is a block diagram of a test system according to the present invention which uses hardware and software to prevent the disclosure of classified test parameters during the testing and repair of equipment. The system includes a test station 10, which in practice may be one unit, but is shown in FIG. 1 as a software environment 10a (which is typically a programmed computer or microprocessor) and test station hardware 10b (which includes stimulus and measurement instruments). The hardware 10b can include frequency generators and power supplies for providing stimulus to the hardware, i.e., test signals, and voltage, current and frequency measuring equipment for determining the response of the hardware to the test signals.

In the microprocessor 10a a secured run-time program is executed to operate the test station. The secured run-time program includes algorithms that encode test commands that are sent over the control/data bus 12a to an interface device 14. The transmission of data between the test station 10 and the interface 14 occurs during a specified time frame and follows a pre-defined format in order to prevent disclosure of the information. The time frame and data are not known to the end-user. This approach prevents the reverse-engineering or experimenting by the end user to decipher the encoding technique.

The secured run time program has two basic inputs, i.e., (1) a series of parameters that are used to program the interface 14 to recognize the encoded commands and (2) the test program commands that identify the tests to be performed. The test program passes to the secured run time program a series of parameters that are used to identify the encoding scheme to be used for that test program. The parameters are used to encode real time the test parameters for the particular hardware 16 which is under test. The test programs are written in a non-descriptive manner that does not reveal any of the classified parameters or test goals of the hardware. The commands issued by the test programs are simply instructions to the secured run-time system, e.g., "Perform Test 1." The secured run-time program converts these simple instructions into the sequence of steps needed to test the particular hardware.

The interface 14 receives encoded commands from the secured run time system. It validates the commands for authenticity and decodes them into a series of hardware control sequences, i.e., commands that cause the hardware 10b to generate appropriate test signals for application to the hardware 16 over bus 18. The interface 14 includes the following major items: (1) Receiving Decoder/Encoder circuitry 11, (2) Local Oscillator 13, (3) Stimulus Generation and Mixing Circuitry 15 and (4) Switching Network 17.

The Receiving Decoder/Encoder circuitry 11 is an encapsulated module that contains the algorithms that allow the interface 14 to decode commands from the test station 10 that are received over control and data bus 12a and to encode data that will be returned to the test station over bus 12a from the measuring instruments and/or the hardware unit 16. When this module 11 receives a valid command sequence from the test station 10, it uses this command and internal algorithms to identify the stimulus that must be applied to the unit 16, the measurement parameters that must be verified, and returns any data that is required by the secured run time system to make a pass/fail decision. The receiving decoder/encoder module 11 is encapsulated to prevent the disassembly of the module. Any attempts to disassemble or access the algorithm resident in memory results in destruction of the module.

The Local Oscillator 13 is used to generate basic frequencies used within the interface 14 to generate the classified frequencies required for testing unit 16. The Local Oscillator frequencies are mixed with test station stimulus or test signals from the hardware 10b in the Stimulus Generation and Mixing Circuitry 15 in order to create the proper frequency signal required for testing the unit 16.

Switching Network 17 provides the routing of the test signals and the measurement signals from hardware 10b through module 15 to the unit 16, under the control of the run-time program of microprocessor 10a as decoded by module 11. The response signals are returned to switching network 17 which routes them to the measuring equipment 10b in test station 10, where they are interpreted and pass fail decisions are made.

Classified stimulus or test signals are applied and removed from bus 18 that connects to the unit 16 on a test-by-test basis, so that manual probing can not be used to try to identify the classified signals. Stimulus/measurement signals are switched between "good signals" and "bad signals," i.e., actual test signals and spurious signals, to prevent identification of the proper test signals.

The test station software incorporates user control software that prevents any unauthorized users from logging on to the system. The user must have a valid user Id and password in order to operate the test system. Any attempt to access the secured run-time system software that is not under test program control results in destruction of the algorithms. Further, the secured run-time program prevents the operator from using typical test program execution modes, such as single step, set breakpoint, or repeat statement mode. This prevents an intentional attempt to analyze the command/data transfers under each specific test sequence in an effort to decipher the encoding technique.

Figure 2A:
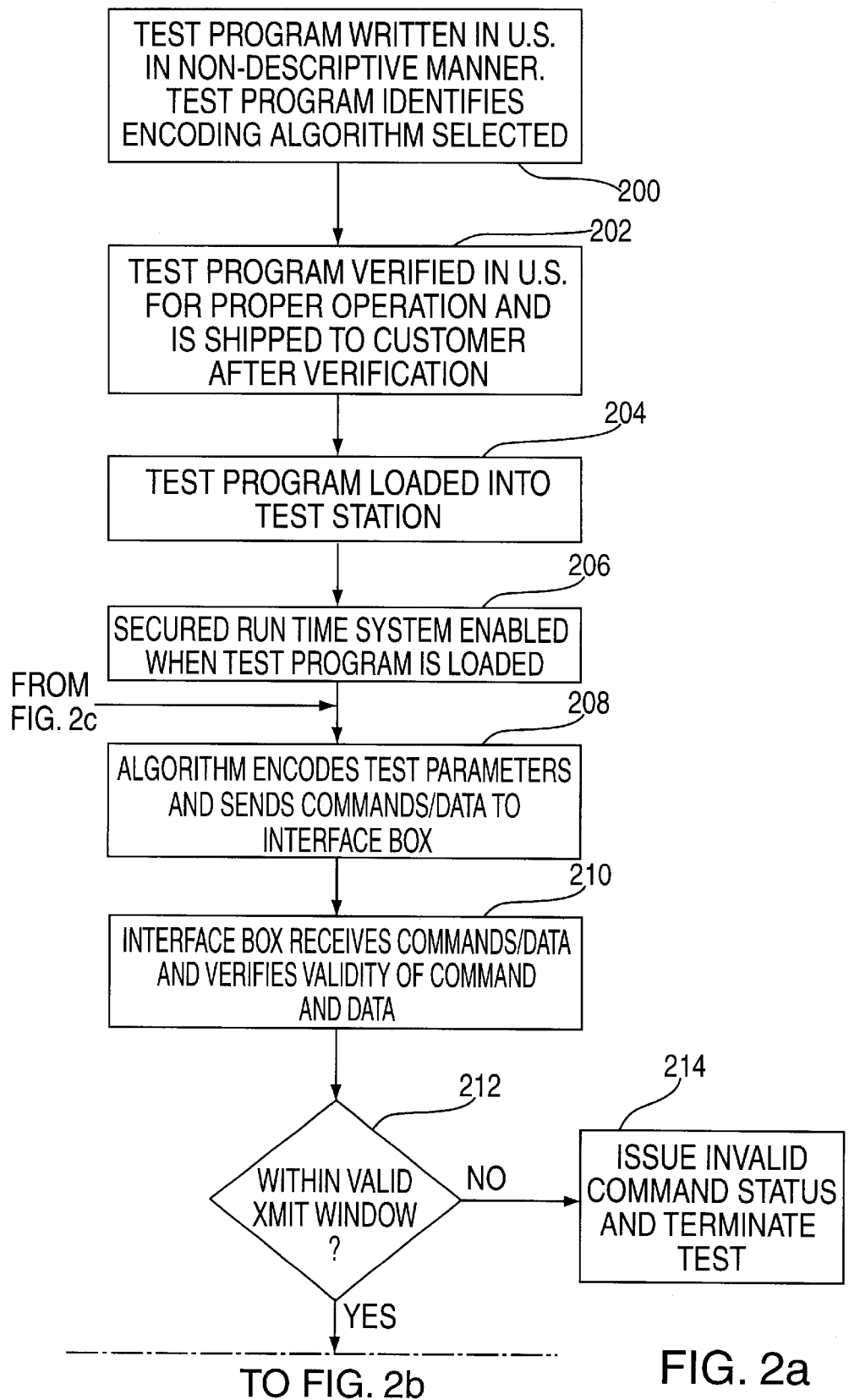
FIGS. 2(a)–2(c) are a flow chart of the operation of the system of FIG. 1.
Figure 2B:
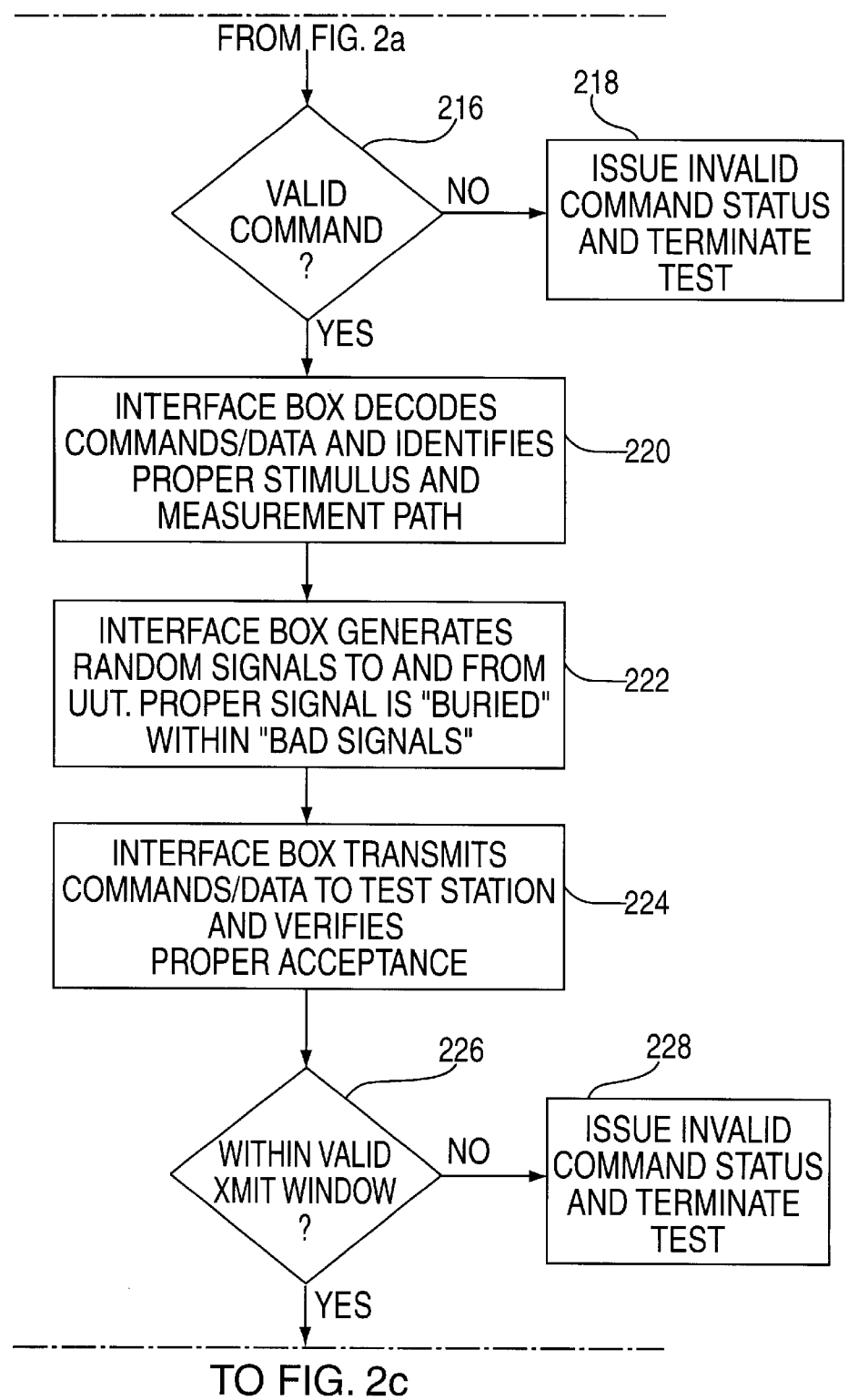
Figure 2C:
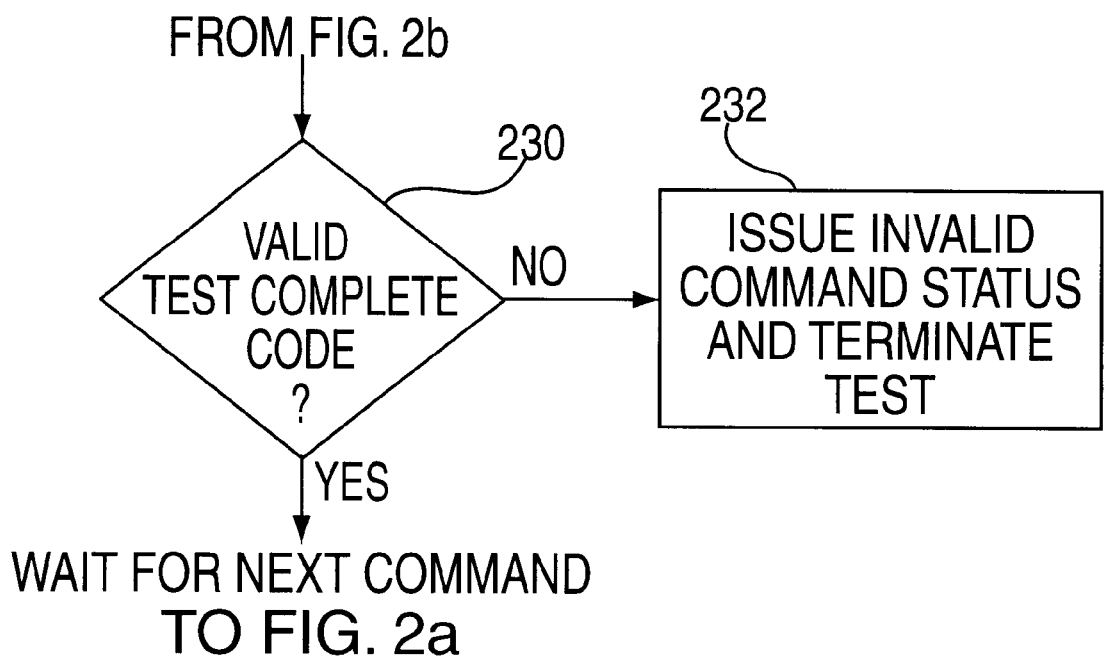

FIG. 2 is flow diagram illustrating the operation of the invention. Initially, a test program is written by the owner or authorized user of the classified information, for example, a United States manufacturer. This test program is written for the particular hardware unit under test 16 based on a knowledge of the algorithms in the test station and selects appropriate encoding algorithms. (Step 200). Once the test program is verified by the manufacturer in the U.S., it can be shipped to the customer or end user, possibly a foreign company. (Step 202). The foreign end user is also provided with an Automatic Test System (ATS) arranged according to FIG. 1.

The end user loads the test program into the test station (Step. 204), which has the effect of enabling the secured run-time program in the ATS (Step 206). The run-time program uses its algorithms to encode the test program and to send appropriate commands and data to the interface 14 as a result thereof (Step 208). The interface 14 receives and validates this information (Step 210). In addition to validating it based on its format and content, a determination is made in Step 212 as to whether the information was sent during the proper transmission window of time. If it was not sent at the proper time, the interface issues an invalid command and the test is terminated (Step 214). If the code is sent within the proper time window, a check is made to make sure is it is a valid command (Step 216). If it is not, an invalid command is issued and the test is terminated (Step 218). If the command is valid, the interface 14 decodes the command and identifies the proper stimulus (test signal) and measurement path from the test hardware to the unit under test 16 (Step. 220).

The test sequence is then initiated. During the test the interface generates random signals to and from the unit 16 so that proper test signals are buried in or mixed with spurious signals to prevent decoding of the algorithms (Step. 222). The interface transmits commands and data to the test station 10a and verifies that the information has been accepted by the run-time program and test program (Step 224). In part this is done by checking to see if the information sent by the interface is within a prescribed time window. If it is not, an invalid command is issued and the test is terminated. This assures that signals cannot be placed on 12a by someone trying to uncover the classified information. If the information is in the proper time period, it is still checked in step 230 to make sure it represents a valid test code. Again, should the code not be valid, an invalid command is issued and the test is terminated. If it is valid, the program recycles to step 208 to await the next step in the test procedure. This continues until the test is completed and the results are in the test station.

The system of the present invention thus allows an owner of sensitive information, e.g., a U.S. manufacturer, to create a test program that can be sent to a foreign user so that user can test the operation of, or repair, hardware in which the information is embedded without gaining access to the information.

While the invention has been particularly shown and described with reference to a preferred embodiment thereof, it will be understood by those skilled in the art that various changes in form and details may be made therein without departing from the spirit and scope of the invention.

We claim:

1. A system for testing a hardware unit containing sensitive information, said system comprising:

a test station having a programmed processor, generating equipment which generates pseudo test signals, and measuring devices which measure the response of the hardware unit to actual test signals, said test station containing a test program from which the contents of the sensitive information cannot be ascertained and a run-time program that interprets the test program to generate encoded commands for carrying out the test; and an interface circuit interposed between said test station and the hardware unit which interface circuit receives the encoded commands and the pseudo test signals from the test station, decodes the encoded commands to generate the actual test signals for the hardware unit containing the sensitive information, routes the actual test signals to the hardware unit under test, receives the response of the hardware unit, encodes it, and sends it to the test station for interpretation.

2. The system of claim 1 wherein the encoding of the commands by said test station involves converting test program code to a different format and transmitting the converted test codes during particular time windows.

3. The system of claim 1 wherein the encoding of the response from the unit under test by the interface circuit involves converting response codes to a different format and transmitting the converted response codes during particular time windows.

4. The system of claim 1 wherein said interface circuit comprises:

an encoder/decoder circuit for decoding and encoding signals from and to said test station by changing their format;

generating equipment for generating the actual test signals; and a switching network for creating paths between the generating equipment and the unit under test based on commands from said test station.

5. The system of claim 4 wherein said interface circuit further includes:

a local oscillator for generating a frequency signal; and generation and mixing circuitry which selects pseudo signals from said generating equipment in said test station and said frequency signal and combines them to form the actual test signals based on the commands from said test station.

6. The system of claim 1 further including a user control which inhibits control of the test station in the absence of a proper user identification code.

7. The system of claim 1 further including an interface validation module which verifies the command codes received by the interface circuit and terminates the test if an unverified signal is received.

8. The system of claim 1 further including a test station validation module which verifies the responses received by the test station from the interface circuit and terminates the test if an unverified signal is received.

9. The system of claim 1 wherein the test station sends spurious signals between valid codes to inhibit detection of the valid codes.

10. The system of claim 1 wherein the interface sends spurious signals between valid codes to inhibit detection of the valid codes.

11. The system of claim 1 wherein said run-time program is a secured run-time program.

12. The system of claim 1 wherein said interface circuit is encapsulated.

13. A method for operating a system for testing as hardware unit containing sensitive information, said system including a test station and an interface circuit interposed between the test station and the hardware unit containing sensitive information, said method comprising the steps of:

loading a test program, from which the contents of the sensitive information cannot be ascertained, and a secured run-time program into a programmed processor of said test station;

executing the secured run-time program to encode the test program to generate commands for carrying out the test;

transmitting the encoded commands to the interface circuit;

providing a path from signal generating equipment and measuring equipment in the test station to the interface circuit;

using the interface circuit to apply the output from the signal generating equipment to the hardware unit under test according to the commands from the test station;

receiving in the interface circuit responses from the hardware unit under test; and encoding the responses and transmitting them to the test station for measurement by the measuring equipment.

14. The method of claim 13 wherein the step of executing the secured run-time program to encode the test program includes at least one of changing the format and specifying a particular time for transmission thereof.

15. The method of claim 13 wherein the step of encoding the responses includes at least one of changing the format and specifying a particular time for transmission thereof.

16. The method of claim 13 wherein the step of using the interface circuit to apply outputs from signal generating equipment to the unit under test comprises the steps of:

creating a local frequency;

selecting outputs of the signal generating equipment according to the commands;

mixing the local frequency and selected outputs; and switching the mixed signals so as to apply them to the unit under test.

17. The method of claim 13 further including the step of blocking access to control of the test station in the absence of a proper user identification code.

18. The method of claim 13 further including the step of verifying the command codes received by the interface circuit and terminating the test if an unverified signal is received.

19. The method of claim 13 further including the step of verifying the responses received by the test station from the interface circuit and terminating the test if an unverified signal is received.

20. The method of claim 13 further including the step of the test station sending spurious signals between valid codes to inhibit detection of the valid codes.

21. The method of claim 13 further including the step of the interface sending spurious signals between valid codes to inhibit detection of the valid codes.

22. A system for testing a hardware unit containing sensitive information, said system comprising:

a test station having a programmed processor, generating equipment which generates pseudo test signals, and measuring devices which measure the response of the hardware unit to actual test signals, said test signals containing a test program from which the contents of the sensitive information cannot be ascertained and a run-time program that interprets the test program to generate encoded commands for carrying out the test; and wherein the encoding of the commands by said test station involves converting test program code to a different format and transmitting the converted test codes during particular time windows; and an encapsulated interface circuit interposed between said test station and the hardware unit which interface circuit receives the encoded commands and the pseudo test signals from the test station, decodes the encoded commands to generate the actual test signals for the hardware unit containing the sensitive information, routes the actual test signals to the hardware unit under test, receives the response of the hardware unit, encodes it, and sends it to the test station for interpretation and wherein the encoding of the response from the unit under test by the interface circuit involves converting response codes to a different format and transmitting the converted response codes during particular time windows.

* * * * *